US006536026B2

(12) United States Patent
Gullapalli

(10) Patent No.: US 6,536,026 B2
(45) Date of Patent: Mar. 18, 2003

(54) METHOD AND APPARATUS FOR ANALYZING SMALL SIGNAL RESPONSE AND NOISE IN NONLINEAR CIRCUITS

(75) Inventor: Kiran K. Gullapalli, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/896,079

(22) Filed: Jun. 30, 2001

(65) Prior Publication Data

US 2003/0009732 A1 Jan. 9, 2003

(51) Int. Cl.[7] ............................................. G06F 17/50
(52) U.S. Cl. ..................... 716/6; 716/1; 716/4; 716/10
(58) Field of Search ............................ 716/1, 4, 6, 10; 703/2, 14

(56) References Cited

U.S. PATENT DOCUMENTS

| 5,379,231 A | * | 1/1995 | Pillage et al. ................. 703/14 |
| 5,995,733 A | | 11/1999 | Roychowdhury ...... 395/500.07 |
| 6,072,947 A | | 6/2000 | Roychowdhury et al. ...................... 395/500.35 |
| 6,151,698 A | * | 11/2000 | Telichevesky et al. ......... 716/1 |
| 6,154,716 A | * | 11/2000 | Lee ............................... 703/2 |

FOREIGN PATENT DOCUMENTS

| EP | 984 373 A2 | 3/2000 | ........... G06F/17/50 |
| WO | WO 00/60540 | 10/2000 | ........... G06N/7/08 |

OTHER PUBLICATIONS

Chen et al., "VHDL Behavioral ATPG and Fault Simulation of Digital Systems," IEEE Transactions of Aerospace and Electronic Systems, vol. 34, No. 2, Apr. 1998.*
Montie et al., "Experimental Self–sensing Results for a Magnetic Bearing," Proceedings of ASME TURBO EXPO, Jun. 4–7, 2001, New Orleans, Lousisiana, USA.*
Makiko Okumura et al., "Numerical Noise Analysis for Nonlinear Circuits with a Periodic Large Signal Excitation Including Cyclostationary Noise Sources", 1993 IEEE, pp. 581–590.
Ricardo Telichevesky et al., "Efficient AC and Noise Analysis of Two–Tone RF Circuits", 1996 ACM, Inc. 0–89791–833–9, 6 pgs.
Jaijeet Roychowdhury et al., "Cyclostationary Noise Analysis of Large RF Circuits with Multitone Excitations", Mar., 1998 IEEE Journal of Solid–State Circuits, vol. 33, No.3, pp. 324–336.
Makiko Okumura et al., "An Efficient Small Signal Frequency Analysis Method of Nonlinear Circuits with Two Frequency Excitations", Mar., 1990 IEEE Transactions On Computer–Aided Design, vol.9, No.3, pp. 225–235.

\* cited by examiner

*Primary Examiner*—David Nelms
*Assistant Examiner*—Dao H. Nguyen
(74) *Attorney, Agent, or Firm*—Joanna G. Chiu; Daniel D. Hill

(57) ABSTRACT

The present invention relates generally to analyzing small signal response and noise in nonlinear circuits. One embodiment relates to a computer implemented method for analyzing an electrical circuit. The method includes receiving a circuit description and circuit element models, generating circuit equations using the circuit description and models, and determining a periodic stead-state response of the electrical circuit in the time domain. The method further includes linearizing the circuit element models about the steady-state response, generating a time-varying linear system of equations, and representing a small signal solution to the time-varying linear system of equations in response to a sine wave input as an amplitude modulated sine wave. The method also includes discretizing the time-varying linear system of equations by discretizing only the amplitude modulation of the small signal solution and performing a time-varying small signal analysis of the electrical circuit using the discretized equations.

20 Claims, 3 Drawing Sheets

METHOD AND APPARATUS FOR ANALYZING SMALL SIGNAL RESPONSE AND NOISE IN NONLINEAR CIRCUITS

FIELD OF THE INVENTION

The present inventions relates generally to circuit analysis, and more specifically, to analyzing small signal response and noise in nonlinear circuits.

RELATED ART

Nonlinear circuits are typically excited by multiple signals. Under the influence of these signals, circuit properties (e.g. currents, voltages, etc.) vary with time. For example, circuits, such as switched-capacitor filters, are excited with a periodic clock and an input signal which is to be processed by the filter. The circuit responds nonlinearly to the clock. The input signal is generally small, not substantially perturbing the periodic steady-state response of the circuit to the periodic clock. The circuit and the periodic clock can be modeled as a periodically time-varying linear circuit. However, accurately analyzing the response of this periodically time-varying linear circuit to the input signal has remained a challenge. Therefore, a need exists for improved analysis of periodically time-varying linear circuits.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
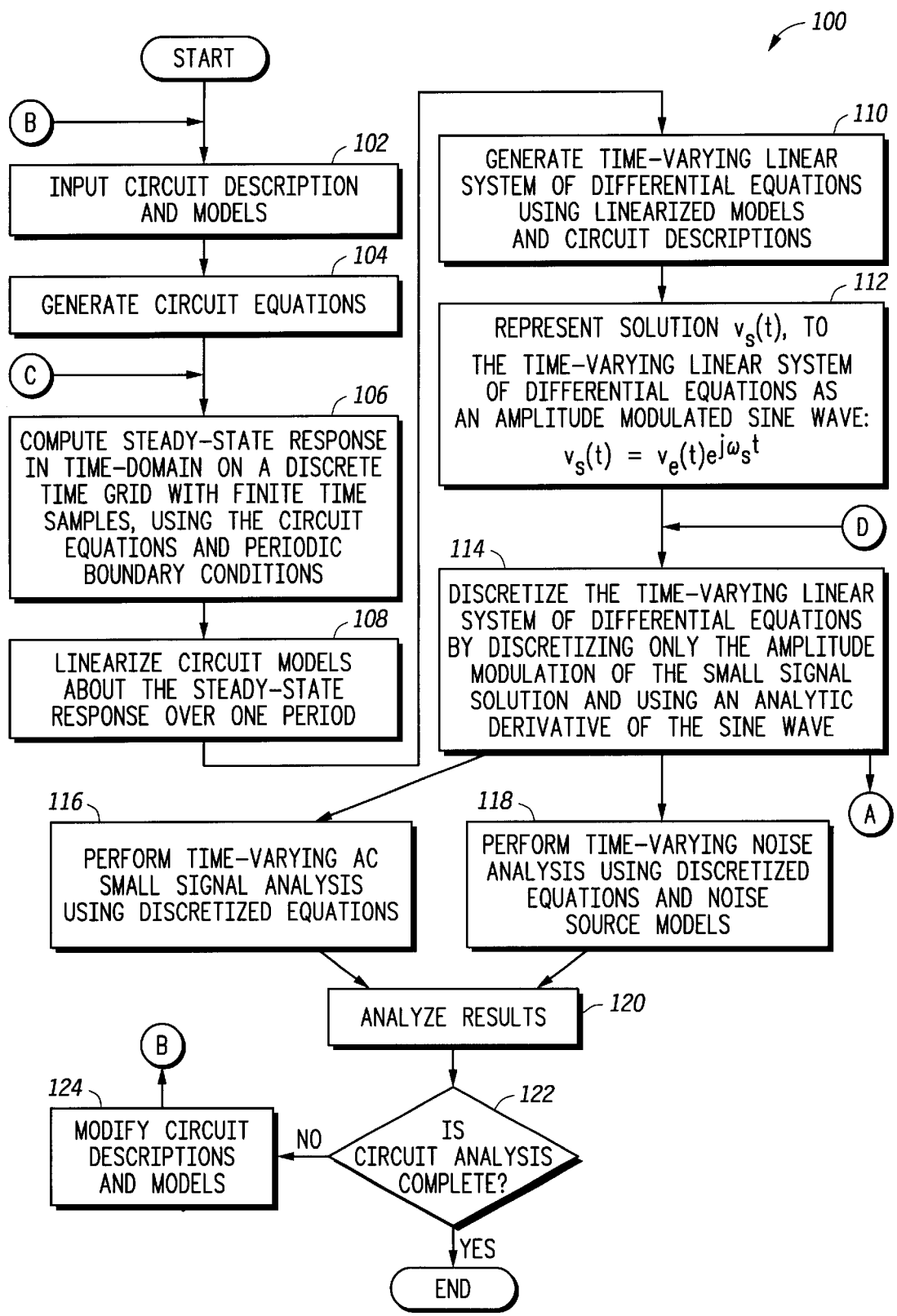
FIG. 1 illustrates, in flow diagram form, a method for analyzing small signal and noise response of a nonlinear circuit, according to one embodiment of the present invention.

FIG. 1 illustrates, in flow diagram form, a method for analyzing a non-linear circuit having periodic excitations according to one embodiment of the present invention. In block 102, a circuit description and corresponding circuit element models are provided. A circuit description represents the elements and their connectivity present in an electrical circuit. Each element within the circuit description has a corresponding circuit element model which describes the behavior of the element. These descriptions and models can be in a variety of different formats (e.g. SPICE format, etc.) and may be contained within one or more computer readable files. Also included within the circuit description are any periodic excitations of the circuit. These excitations may include any number of both large amplitude and small amplitude periodic excitations. Large periodic amplitude excitations (i.e. large signals) refer to those that determine the steady-state response of the circuit and small amplitude periodic excitations (i.e. small signals) refer to those that do not substantially perturb the steady-state response of the circuit. Note that noise within a circuit may, in some embodiments, also be treated as small signals.

In block 104, circuit equations are generated based on the circuit description and models. These circuit equations embody the traditional circuit laws such as Kirchoff's voltage and current laws (KVL and KCL). The current contributions of the individual circuit elements at each node of the circuit can be determined by evaluating the circuit element models. The result is a system of nonlinear differential equations.

In block 106, the steady-state response is computed in the time-domain in response to the large periodic excitations, such as, for example, a clock. The steady-state response generally refers to the state of the circuit after all transient effects have died off. This response is computed by solving the resulting system of nonlinear differential equations generated in block 104 as constrained by the periodic boundary conditions due to the periodic excitation. Furthermore, the differential equations are solved on a discrete time grid having a finite number of time sample points. Any standard method may be used to solve this system of nonlinear equations, such as, for example, the shooting-Newton method. Note that for this computation, the small amplitude excitations are ignored.

For example, the following equations represent the KCL for the circuit (equation 1) and the corresponding boundary conditions (equation 2):

$$q(v_L(t)) + i(v_L(t)) + u_L = 0 \qquad \text{Equation 1}$$

$$v_L(T_L) = v_L(0) \qquad \text{Equation 2}$$

In the above equations, $u_L(t)$ refers to the large amplitude periodic excitation having a period of $T_L = 2\pi/\omega_L$ (such as a clock that is a square wave). Also, $i(V_L(t))$ is the vector of resistive currents and $q(v_L(t))$ is the vector of capacitive currents.

In block 108, the circuit element models are linearized about the steady-state response over one period of the excitation. This yields the time-varying conductances, $g(t)$, and capacitances, $c(t)$, for each circuit element model. This is needed to construct the linear time-varying equations of block 110 (which will be discussed below). The equations for $g(t)$ and $c(t)$ are as follows:

$$g(t) = \frac{di(v_L(t))}{dv_L} \qquad \text{Equation 3}$$

$$c(t) = \frac{dq(v_L(t))}{dv_L} \qquad \text{Equation 4}$$

In block 110, the time-varying conductances and capacitances are used to generate the time-varying linear system of differential equations that embody Kirchoff's current laws for the small signal response. This produces a representation of the circuit's response to the small excitations (see equation 5 below). Therefore, the nonlinear system of equations computed in block 104 is approximated with a linear system of equations with time-varying coefficients.

$$\frac{d[c(t)v_S(t)]}{dt} + g(t)v_S(t) + u_S(t) = 0 \qquad \text{Equation 5}$$

In the above equation, $v_s(t)$ is the response to $u_s(t)$ where $u_s(t)$ refers to a small amplitude excitation. Note also that $c(t)$ and $g(t)$ are $T_L$ periodic, such that $g(t)=g(t+T_L)$ and $c(t)=c(t+T_L)$. Thus the system is linear and periodically time-varying with period $T_L$. This system with period $T_L=2\pi/\omega_L$ responds to a sinusoidal input of frequency $\omega_s$ (i.e. the frequency of the small amplitude excitation, $u_s(t)$) with a spectrum of components at:

$$\omega = \omega_s + l\omega_L \text{ where } l=0,\pm 1 \pm 2,$$  Equation 6

This means that:

$$v_S(t) = \sum_l V_e^l e^{j(\omega_S + l\omega_L)t} = v_e(t)e^{j\omega_S t}$$  Equation 7

In block 112, $v_s(t)$ is represented in mixed frequency-time domain (MFT) as $v_e(t)e^{j\omega_s t}$ (see equation 7). That is, $V_e(t)$ is the time-varying complex amplitude (i.e. amplitude modulation) of the sine wave represented by $e^{j\omega_s t}$. Without loss of generality, excitations of the form $u_s(t)=ue^{j\omega_s t}$ are assumed. Here, u is a constant. Therefore, by substituting $v_e(t)e^{j\omega_s t}$ for $v_s(t)$ in equation 5 above, the following equation is obtained:

$$\frac{d[c(t)v_e(t)e^{j\omega_S t}]}{dt} + g(t)v_e(t)e^{j\omega_S t} + ue^{j\omega_S t} = 0$$  Equation 8

In block 114, the time-varying linear system of differential equations is descretized by discretizing only the amplitude modulation, $V_e(t)$, and using an analytic derivative of the sine wave, $e^{j\omega_s t}$, as follows:

$$\frac{d[c(t)v_e(t)]}{dt} + j\omega_S c(t)v_e(t) + g(t)v_e(t) + u = 0$$  Equation 9

Prior art discretizes $c(t)\cdot v_e(t)\cdot e^{j\omega_s t}$ in its entirety using a finite difference approximation such as the backward Euler formula, but the results obtained using this method are very inaccurate. Improving the accuracy requires a much larger number of samples of the large signal steady state, making the prior art method impractical. The maximum allowable spacing between time-samples for the large signal steady state is directly related and inversely proportional to the small signal frequency. This disadvantage has severe consequences in the analysis of noise because the power spectrum of noise is very broadband, meaning that the time-sample spacing for the steady state must be very small, even though such small time-sample spacing is not necessary to obtain the steady state accurately. This results in a very expensive method for small signal and noise analyses. Therefore, an embodiment of the present inventions offers an improved method that only discretizes $c(t)v_e(t)$ using finite difference approximations, and thus avoids many of the disadvantages introduced by the prior art method.

In matrix form, assuming, for example, the use of the backward Euler formula for discretizing the time-derivative, equation 9 can be written as shown in equation 10 below.

$$\begin{bmatrix} G_1 + j\omega_S C_1 + \frac{C_1}{h_1} & 0 & 0 & -\frac{C_M}{h_1} \\ -\frac{C_1}{h_2} & G_2 + j\omega_S C_2 + \frac{C_2}{h_2} & 0 & 0 \\ 0 & 0 & \ddots & \vdots \\ 0 & 0 & -\frac{C_{M-1}}{h_M} & G_M + j\omega_S C_M + \frac{C_M}{h_M} \end{bmatrix} \begin{bmatrix} v_{e1} \\ v_{e2} \\ \vdots \\ v_{eM} \end{bmatrix} = -\begin{bmatrix} u \\ u \\ \vdots \\ u \end{bmatrix}$$  Equation 10

G and C are matrices composed of the g(t) and c(t) of each circuit element. Here the the subscript on G,C, and h refers to the index of the time sample, and h is the time-step between times samples. Note that the left-most matrix in equation 10 is referred to as J in the following description.

Embodiments of the present invention, which utilize the amplitude modulated sine wave (i.e. MFT) representation and the improved discretization (as illustrated with equations 9 and 10), remove the need to consider the Nyquist rate corresponding to the frequency of the small signal excitation during the computation of the steady state solution. For example, in these embodiments, the steady state response is considered in determining the number of time samples needed. The envelope ($v_e(t)$) of the small signal response (which varies on the same time scale as the steady state response) is also considered, as will be discussed in reference to FIGS. 2 and 3 below. For example, a sufficiently large truncation error in the envelope may require the need for additional time samples. This improved discretization also allows for improved noise analysis, as will be discussed below.

After forming the discretized system of time-varying linear equations, a time-varying AC small signal analysis (block 116) or a time-varying noise analysis (block 118) may be performed. Each of these will be discussed in more detail in reference to FIGS. 2 and 3, respectively, below. After performing at least one of these two analyses, the results are analyzed in block 120. For example, the results may be post-processed to derive additional quantities which allow the circuit designer to determine if the circuit design meets required specifications. The designer can then determine whether the circuit analysis is complete. If so, the design analysis is complete; otherwise, the designer may modify the circuit description and models (in block 124) and repeat the analysis process at block 102. For example, the designer may change the circuit topology or modify transistor geometries or process parameters to achieve or surpass the required specifications.

Figure 2:
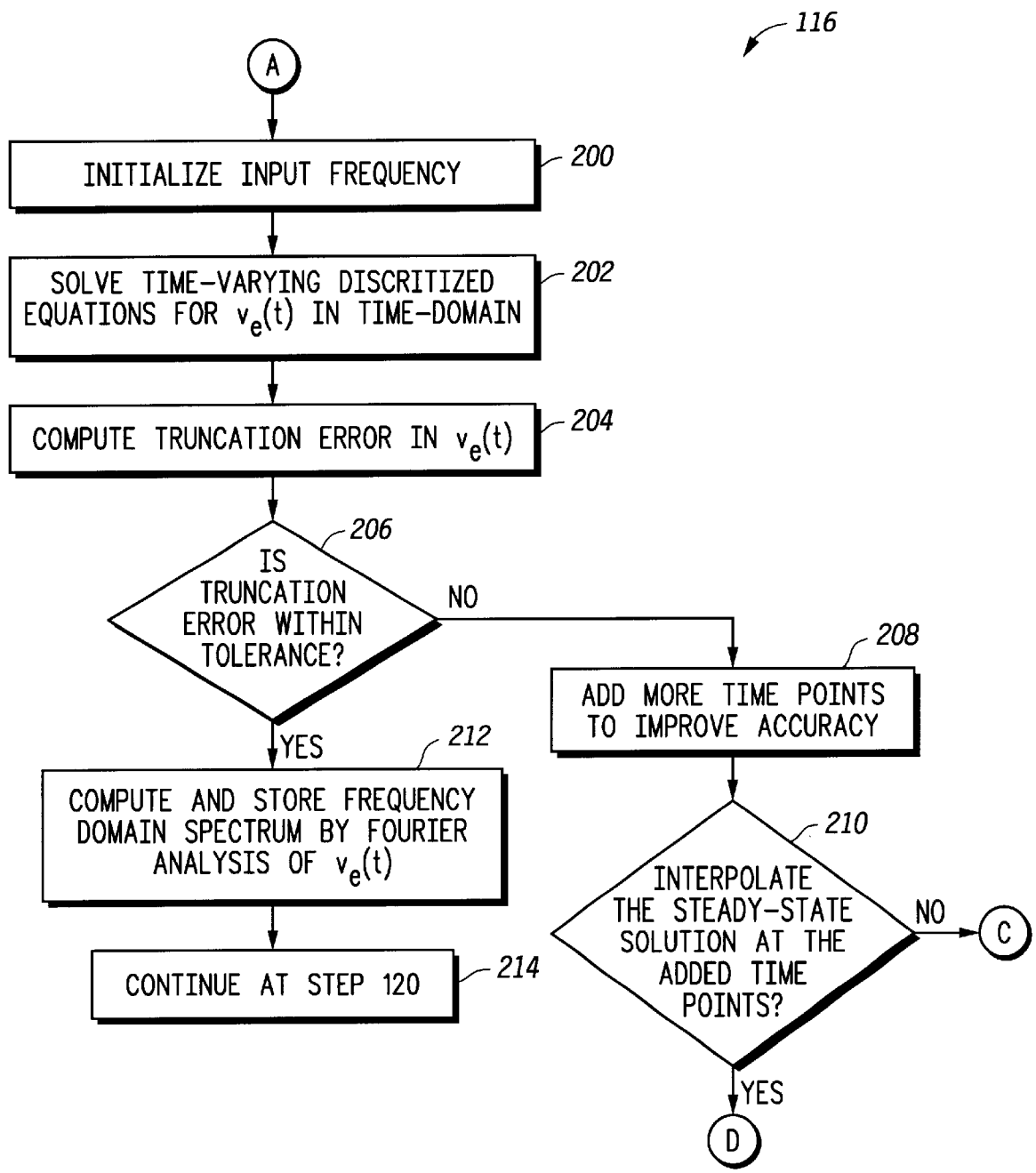
FIG. 2 illustrates, in flow diagram form, a method for performing small signal analysis according to one embodiment of the present invention.

FIG. 2 illustrates, in flow diagram form, the time-varying small signal analysis of block 116 in FIG. 1. In block 200, the input frequency is initialized. That is, a specific frequency point is chosen at which to do the small signal analysis. Flow continues to block 202 where the time-varying discretized equations for $v_e(t)$ are solved in the time-domain. The equations are solved in the time-domain because the steady state is most efficiently obtained in the time-domain when the steady state voltages are very non-sinusoidal. Because the time-samples are not necessarily uniformly spaced, the small signal response must also be computed in the time-domain. Further, in this situation, the solution of the small signal response is also more efficiently obtained in the time-domain. Note that the matrix equation show in equation 10 can be solved with any known means of solving linear systems of equations, including matrix implicit iterative methods based on Krylov sub-spaces. If a good preconditioner is used in such methods, the solution can be obtained in a few iterations. The discretization performed in block 114 therefore allows for the use of an improved preconditioner. Corresponding to equation 10, the preconditioner, P, may have the following form:

$$P = \begin{bmatrix} G_1 + j\omega_S C_1 + \dfrac{C_1}{h_1} & 0 & 0 & 0 \\ -\dfrac{C_1}{h_2} & G_2 + j\omega_S C_2 + \dfrac{C_2}{h_2} & 0 & 0 \\ 0 & 0 & \ddots & \vdots \\ 0 & 0 & -\dfrac{C_{M-1}}{h_M} & G_M + j\omega_S C_M + \dfrac{C_M}{h_M} \end{bmatrix} \qquad \text{Equation 11}$$

The above preconditioner (equation 11) offers a good approximation to the original matrix but is much easier to invert. The above preconditioner includes more of the small signal response as compared to prior art methods, thus making it an improved preconditioner. The above preconditioner therefore makes the solution in the time-domain more efficient than a corresponding frequency-domain method. When the voltages, or the G and C matrices of the large signal steady state are not smooth in time, the preconditioner commonly used in frequency-domain methods is not very good, leading to expensive computations with respect to both time and resources.

Flow then proceeds to block 204, where the truncation error in $v_e(t)$ is computed. This truncation error is an estimate of the difference between the numerically computed solution and the unknown exact solution. The designer also specifies the error tolerance to a predetermined amount.

At decision diamond 206, if the truncation error is within a predetermined error tolerance, flow continues to block 212 where the frequency domain spectrum of the small signal response is computed using Fourier analysis of $v_e(t)$. The frequency spectrum can also be stored for future use and analysis. Flow then continues at block 214 where flow returns to block 120 (of FIG. 1). If the truncation error is not within the predetermined tolerance, flow continues to block 208 where more time sample points are needed in order to improve the accuracy and thus reduce the error in $v_e(t)$.

At decision diamond 210, it is determined whether interpolation of the steady state solution at the added time points is to be performed prior to discretizing the time-varying linear system of differential equations. If so, flow proceeds through point D to block 114. Alternatively, no interpolation can be performed, and flow would return through point C to block 106 where a new steady-state response in the time-domain, utilizing the added time sample points, is computed. Flow then proceeds as discussed above through blocks 108, 110, 112, and 114 until reaching block 200 again. The input frequency is reinitialized to the selected frequency point in order to reperform blocks 202 and 204 based on the discretized equations derived using the new added time sample points. If the truncation error is within tolerance, flow continues as above to block 212, and if not, the above process is repeated through block 208, where more points are added.

Alternatively, a frequency range can be analyzed, where the input frequency is initialized to some start frequency (At block 200) and after each frequency is analyzed, the frequency is updated to the next frequency with a frequency step and the process is repeated at block 202. Thus flow 116 can be used to analyze a single frequency point or a range of frequency points.

Figure 3:
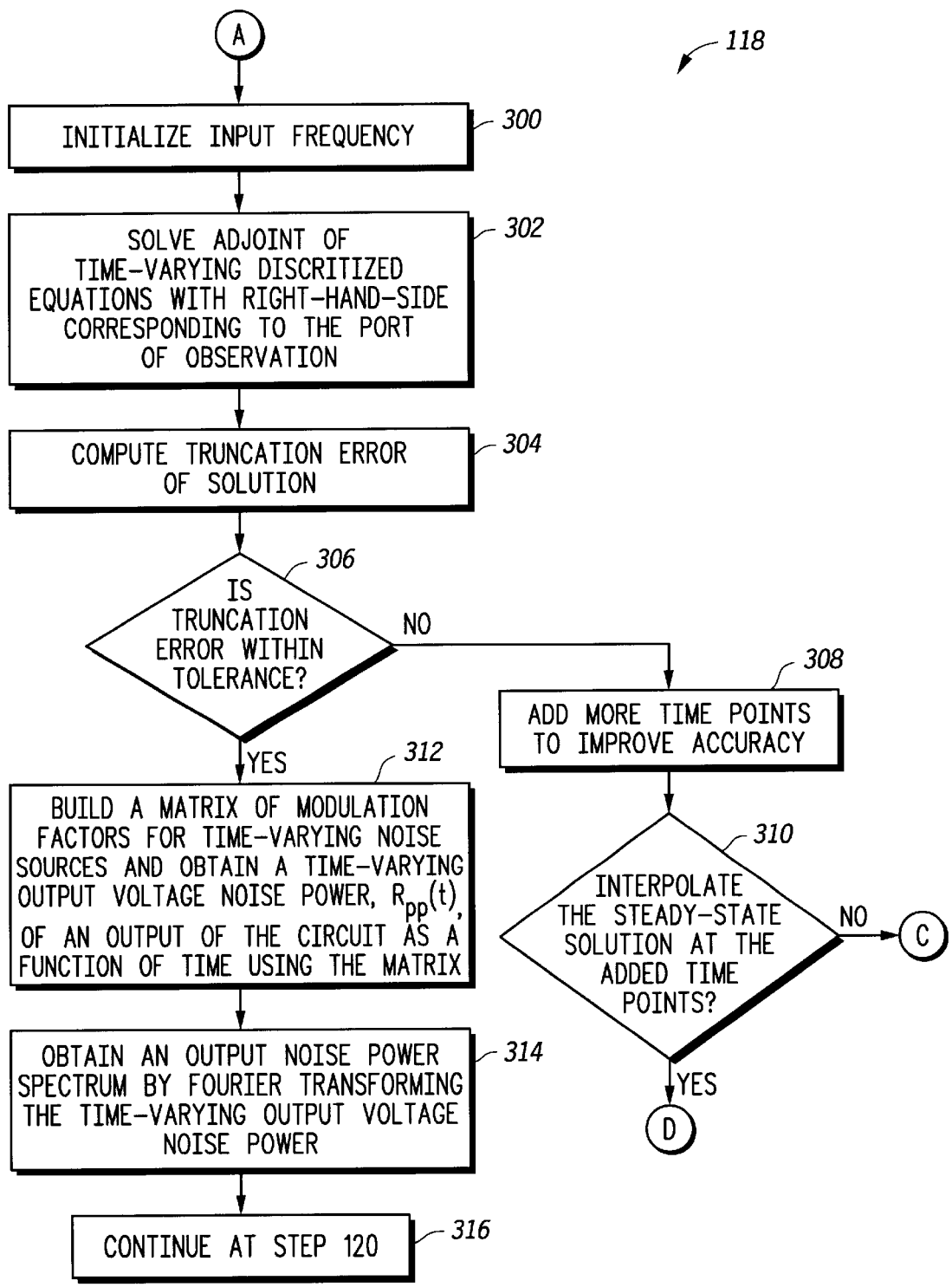
FIG. 3 illustrates, in flow diagram form, a method for performing noise analysis according to one embodiment of the present invention.

FIG. 3 illustrates, in flow diagram form, the time-varying noise analysis in the time-domain of block 118 in FIG. 1. In block 300, the input frequency is initialized. That is, a specific frequency point is chosen at which the noise response is desired. Flow continues to block 302 where the adjoint of the time-varying descretized equations for $v_e(t)$ are solved in the time-domain. (Note that in the embodiment of FIG. 3, $v_e(t)$ refers to the small signal response to $u_s(t)$ of the adjoint system.) The adjoint matrix corresponding to the discretized equations is obtained by transposing the discretized equations that were solved in block 202 of FIG. 2. (However, note that the entire flow 116 of FIG. 2 need not be performed if only a noise analysis response is desired.) The right hand side (i.e. the vector to the right of the equal sign) in the adjoint system shown below in equation 12 is defined by the node at which the noise response is desired. An example of the structure of an adjoint system is as follows:

$$\begin{bmatrix} G_1^T + j\omega_S C_1^T + \dfrac{C_1^T}{h_2} & -\dfrac{C_1^T}{h_2} & 0 & 0 \\ 0 & G_2^T + j\omega_S C_2^T + \dfrac{C_2^T}{h_3} & \ddots & 0 \\ 0 & 0 & \ddots & -\dfrac{C_{M-1}^T}{h_M} \\ -\dfrac{C_M^T}{h_1} & 0 & 0 & G_M^T + j\omega_S C_M^T + \dfrac{C_M^T}{h_1} \end{bmatrix} \begin{bmatrix} v_{e1} \\ v_{e2} \\ \vdots \\ v_{eM} \end{bmatrix} = - \begin{bmatrix} u_p \\ u_p \\ \vdots \\ u_p \end{bmatrix} \qquad \text{Equation 12}$$

Here, the superscript "T" on the G and C matrices indicates that the row and columns of these matrices are interchanged. (Note that the matrix on the far left is a time varying matrix that may be referred to herein as $J_A$.) G and C are matrices composed of the g(t) and c(t) of each circuit element. In the above example (equation 12), $u_p$ indicates that the noise is required at node "p" of the electrical circuit. Therefore, the p'th element of the vector $u_p$ is 1, and all other elements of the vector $u_p$ are 0.

In block 304, the truncation error in $v_e(t)$ is computed. As described above, this truncation error is an estimate of the difference between the numerically computed solution and the unknown exact solution. Again, the designer also specifies the error tolerance to a predetermined amount.

At decision diamond 306, if the truncation error is within a predetermined error tolerance, flow continues to block 312. Hence it can be seen how the discretized equations discussed above with reference to block 114 allows for improved small signal as well noise analysis.

In block 312, a matrix is constructed of the modulation factors for the time-varying noise sources within the circuit using information from the steady-state solution computed in block 106 and the noise models provided as part of the circuit description. A time-varying output voltage noise power, $R_{pp}(t)$, of an output is then obtained as a function of time using the matrix. In this embodiment, noise models refer to the equations that define the noise power spectrum of each noise source in each circuit element. The modulation factors refer to the modeling of time-varying noise sources as modulated stationary noise sources, as seen below:

$$n(t)=m(t)n_s(t) \qquad \text{Equation 13}$$

In equation 13, n(t) is the cyclostationary noise which is modeled as a stationary noise source, $n_s(t)$, modulated by the periodic time-varying modulation m(t). Each noise source in the circuit description is modeled similarly. Without loss of generality, the variance of $n_s(t)$ can be set to unity.

Using the modulation factors and the small signal solution obtained in block 302, the time-varying output noise power, $R_{pp}(t)$, at the selected node is computed (block 312) as a function of time in the time-domain, where, in one embodiment, the output noise power is computed entirely in the time-domain. For example, it can be computed as follows (if only white noise sources exist):

$$R_{pp}(t)=J^{-1} AMSMA^T J_A^{-1} U_P \qquad \text{Equation 14}$$

In equation 14, M is a block diagonal matrix with one block for each time sample. Each block of M is a diagonal matrix each element of which is the modulation factor of the corresponding noise source. S is a matrix containing the time-invariant portion of the noise power densities. A is the noise source incidence matrix which describes how the individual noise sources are connected. J and $J_A$ are the time varying matrices discussed in equations 10 and 12. $U_P$ is the vector indicated as the right hand side in equation 12.

If some noise sources are not white but have a spectrum that depends on frequency, the computation of the output noise power density is performed as follows:

$$R_{pp}(t)=J^{-1}AMF^{-1}SFMA^T J_A^{-1} U_P \qquad \text{Equation 15}$$

In equation 15, S is a matrix containing the frequency dependence of the power spectrum of the corresponding noise sources in the circuit description. F is the matrix corresponding to the Fourier integral.

Flow then continues to block 314. In addition to looking at the time-domain results, designers may also be interested in the time-averaged output noise power spectrum in the frequency-domain (block 314). This can be obtained by Fourier transforming the time-varying output voltage noise power obtained in block 312. Flow then continues at block 316 where flow returns to block 120 (of FIG. 1).

If, at decision diamond 306, the truncation error is not within the predetermined tolerance, flow continues to block 308 where more time sample points are needed in order to improve the accuracy and thus reduce the error in $v_e(t)$. At decision diamond 310, it is determined whether interpolation of the steady state solution at the added time points is to be performed prior to discretizing the time-varying linear system of differential equations. If so, flow proceeds through point D to block 114. Alternatively, no interpolation can be performed, and flow would return through point C to block 106 where a new steady-state response in the time-domain, utilizing the added time sample points, is computed. Flow then proceeds as discussed above through blocks 108, 110, 112, and 114 until reaching block 300 again. The input frequency is reinitialized to the selected frequency point in order to reperform blocks 302 and 304 based on the discretized equations derived using the new added time sample points. If the truncation error is within tolerance, flow continues as above to block 312, and if not, the above process is repeated through block 308, where more points are added.

Alternatively, as described above in reference to FIG. 2, a frequency range can be analyzed, where the input frequency is initialized to some start frequency and after each frequency is analyzed, the frequency is updated with the next frequency step and the process is repeated at block 302. Thus flow 118 can be used to analyze noise responses at a single frequency point or within a range of frequency points.

In the foregoing specification, the invention has been described with reference to specific embodiments. However, one of ordinary skill in the art appreciates that various modifications and changes can be made without departing from the scope of the present invention as set forth in the claims below. For example, the methods (or portions of the methods) described herein may be computer implemented methods that can be embodied in software or any computer program product. The software or computer program product may include a plurality of instructions which are executed by a computer (i.e. a processor) coupled to the computer program product. (Note that the software or computer product can also be embedded within the computer or processor as well.) The computer program product can include any computer readable medium (or plurality of computer readable media) including, for example, computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also note that in some embodiments, the term small signal solution may refer to either small signal response or noise response in a circuit (since both may considered small signals, i.e. those that do not substantially perturb the steady-state of the circuit). Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A computer implemented method for analyzing an electrical circuit, comprising the steps of:

receiving a circuit description and circuit element models;

generating circuit equations using the circuit description and the circuit element models;

determining a periodic steady-state response of the electrical circuit in the time domain, on a discrete time grid with finite time samples, using the circuit equations and periodic boundary conditions;

linearizing the circuit element models about the steady-state response over a predetermined time period;

generating a time-varying linear system of equations using the linearized circuit element models and the circuit descriptions:

representing a small signal solution to the time-varying linear system of equations, in response to a sine wave input, as an amplitude modulated sine wave;

discretizing the time-varying linear system of equations by discretizing only the amplitude modulation of the small signal solution and using an analytic derivative of the sine wave; and performing a time-varying small signal analysis of the electrical circuit using the discretized equations.

2. The method of claim 1, wherein the step of performing a time-varying small signal analysis further comprises the steps of:

initializing an input frequency;

solving the discretized equations in the time-domain using the predetermined number of time points to obtain a small signal response; and determining a truncation error of the obtained small signal response.

3. The method of claim 2, further comprising the steps of:

determining that the truncation error is within a predetermined truncation error tolerance; and computing and storing a frequency domain spectrum by Fourier analysis of at least a portion of the small signal response.

4. The method of claim 2, further comprising the steps of:

determining that the truncation error is outside a predetermined truncation error tolerance;

adding time points to the predetermined number of time points;

interpolating the steady state response at the additional time points; and discretizing the time-varying linear system of equations using the additional time points and the mixed frequency-time domain representations.

5. The method of claim 2, further comprising the steps of:

determining that the truncation error is outside a predetermined truncation error tolerance;

adding time points to the predetermined number of time points; recomputing the steady-state response in the time domain; and discretizing the time-varying linear system of equations using the additional time points and the mixed frequency-time domain representations.

6. The method of claim 1, further comprising the step of:

performing a time-varying noise analysis using the discretized equations and time-varying noise source models.

7. The method of claim 6, wherein the step of performing a time-varying noise analysis further comprises the steps of:

initializing an input frequency;

solving adjoint of the time-varying discretized equations corresponding to a predetermined circuit node using a predetermined number of time points;

determining that a truncation error is within a predetermined tolerance;

computing the noise power spectral densities for time-varying noise sources;

obtaining a time-varying output voltage noise power of an output terminal of the circuit as a function of time; and obtaining an output noise power spectrum by Fourier transforming the time-varying output voltage noise power.

8. The method of claim 6, wherein the step of performing a time-varying noise analysis further comprises the steps of:

initializing an input frequency;

solving adjoint of the time-varying discretized equations corresponding to a predetermined circuit node;

determining that a truncation error is outside a predetermined tolerance;

adding time points to the predetermined number of time points; and recomputing the steady-state response in the time domain.

9. The method of claim 6, wherein the step of performing a time-varying noise analysis further comprises the steps of:

initializing an input frequency;

solving adjoint of the time-varying discretized equations corresponding to a predetermined circuit node;

determining that a truncation error is outside a predetermined tolerance;

adding time points to the predetermined number of time points;

interpolating a steady state solution at the additional time points; and discretizing the time-varying linear system of equations using the additional time points and the mixed frequency-time domain representations.

10. The method of claim 6, further comprising the steps of:

analyzing a result of the small signal analysis and a result of the time-varying noise analysis;

determining that the circuit analysis is incomplete; and modifying the circuit description and the circuit element models.

11. A computer program product comprising:

computer readable program code means for receiving a circuit description and circuit element models;

computer readable program code means for generating circuit equations using the circuit description and the circuit element models;

computer readable program code means for determining a periodic steady-state response of the electrical circuit in the time domain, on a discrete time grid with finite time samples, using the circuit equations and periodic boundary conditions;

computer readable program code means for linearizing the circuit element models about the steady-state response over a predetermined time period;

computer readable program code means for generating a time-varying linear system of equations using the linearized circuit element models and the circuit descriptions;

computer readable program code means for representing a small signal solution to the time-varying linear system of equations, in response to a sine wave input, as an amplitude modulated sine wave;

computer readable program code means for discretizing the time-varying linear system of equations by discretizing only the amplitude modulation of the small signal solution and using an analytic derivative of the sine wave; and computer readable program code means for performing a time-varying small signal analysis of the electrical circuit using the discretized equations.

12. The computer program product of claim 11, wherein the computer readable program code means for performing a time-varying small signal analysis further comprises:

computer readable program code means for initializing an input frequency;

computer readable program code means for solving the discretized equations in the time-domain using the predetermined number of time points to obtain a small signal response; and computer readable program code means for determining a truncation error of the obtained small signal response.

13. The computer program product of claim 12, further comprising:
computer readable program code means for determining that the truncation error is within a predetermined truncation error tolerance; and
computer readable program code means for computing and storing a frequency domain spectrum by Fourier analysis of at least a portion of the small signal response.

14. The computer program product of claim 12, further comprising:
computer readable program code means for determining that the truncation error is outside a predetermined truncation error tolerance;
computer readable program code means for adding time points to the predetermined number of time points;
computer readable program code means for interpolating the steady state response at the additional time points; and
computer readable program code means for discretizing the time-varying linear system of equations using the additional time points and the mixed frequency-time domain representations.

15. The computer program product of claim 12, further comprising:
computer readable program code means for determining that the truncation error is outside a predetermined truncation error tolerance;
computer readable program code means for adding time points to the predetermined number of time points;
computer readable program code means for recomputing the steady-state response in the time domain; and
computer readable program code means for discretizing the time-varying linear system of equations using the additional time points and the mixed frequency-time domain representations.

16. The computer program product of claim 11, further comprising:
computer readable program code means for performing a time-varying noise analysis using the discretized equations and time-varying noise source models.

17. The computer program product of claim 16, wherein computer readable program code means for performing a time-varying noise analysis further comprises:
computer readable program code means for initializing an input frequency;
computer readable program code means for solving adjoint of the time-varying discretized equations corresponding to a predetermined circuit node using a predetermined number of time points;
computer readable program code means for determining that a truncation error is within a predetermined tolerance;
computer readable program code means for computing the noise power spectral densities for time-varying noise sources;
computer readable program code means for obtaining a time-varying output voltage noise power of an output terminal of the circuit as a function of time; and
computer readable program code means for obtaining an output noise power spectrum by Fourier transforming the time-varying output voltage noise power.

18. The computer program product of claim 16, wherein the computer readable program code means for performing a time-varying noise analysis further comprises:
computer readable program code means for initializing an input frequency;
computer readable program code means for solving adjoint of the time-varying discretized equations corresponding to a predetermined circuit node;
computer readable program code means for determining that a truncation error is outside a predetermined tolerance;
computer readable program code means for adding time points to the predetermined number of time points; and
computer readable program code means for recomputing the steady-state response in the time domain.

19. The computer program product of claim 16, wherein the computer readable program code means for performing a time-varying noise analysis further comprises:
computer readable program code means for initializing an input frequency;
computer readable program code means for solving adjoint of the time-varying discretized equations corresponding to a predetermined circuit node;
computer readable program code means for determining that a truncation error is outside a predetermined tolerance;
computer readable program code means for adding time points to the predetermined number of time points;
computer readable program code means for interpolating a steady state solution at the additional time points; and
computer readable program code means for discretizing the time-varying linear system of equations using the additional time points and the mixed frequency-time domain representations.

20. The computer program product of claim 16, further comprising:
computer readable program code means for analyzing a result of the small signal analysis and a result of the time-varying noise analysis;
computer readable program code means for determining that the circuit analysis is incomplete; and
computer readable program code means for modifying the circuit description and the circuit element models.

* * * * *